United States Patent
Wu et al.

(10) Patent No.: US 8,744,794 B2
(45) Date of Patent: Jun. 3, 2014

(54) METHOD AND APPARATUS FOR CHARACTERIZING AN INTERIOR PERMANENT MAGNET MACHINE

(75) Inventors: Long Wu, Fargo, ND (US); Robert Shaw, Moorhead, MN (US)

(73) Assignee: Deere & Company, Moline, IL (US)

( * ) Notice: Subject to any disclaimer, the term of this patent is extended or adjusted under 35 U.S.C. 154(b) by 450 days.

(21) Appl. No.: 13/036,286

(22) Filed: Feb. 28, 2011

(65) Prior Publication Data

US 2012/0221280 A1 Aug. 30, 2012

(51) Int. Cl.
- G01L 25/00 (2006.01)
- G01M 7/00 (2006.01)
- G01M 9/00 (2006.01)
- G01M 10/00 (2006.01)
- G01M 17/00 (2006.01)
- H02P 6/16 (2006.01)
- H02P 6/12 (2006.01)
- G01L 3/22 (2006.01)

(52) U.S. Cl.
USPC .................. 702/113; 318/400.07; 318/400.12; 318/400.15; 73/862.17

(58) Field of Classification Search
USPC ......................................... 73/862.17, 862.18
See application file for complete search history.

(56) References Cited

U.S. PATENT DOCUMENTS

| | | | |
|---|---|---|---|
| 4,023,083 A | 5/1977 | Plunkett | |
| 4,814,677 A | 3/1989 | Plunkett | |
| 5,428,283 A | 6/1995 | Kalman et al. | |
| 5,486,748 A | 1/1996 | Konrad et al. | |
| 5,623,104 A * | 4/1997 | Suga ........................... | 73/862.18 |
| 5,914,582 A | 6/1999 | Takamoto et al. | |
| 6,275,000 B1 | 8/2001 | Nishimura | |
| 7,045,988 B2 | 5/2006 | Ha et al. | |
| 7,157,878 B2 | 1/2007 | Collier-Hallman | |
| 7,573,227 B2 | 8/2009 | Kasaoka et al. | |
| 7,586,286 B2 | 9/2009 | Cheng et al. | |
| 7,733,044 B2 | 6/2010 | Nakamura et al. | |
| 2006/0097688 A1 | 5/2006 | Patel et al. | |
| 2006/0247829 A1 | 11/2006 | Sato | |
| 2009/0212734 A1 | 8/2009 | Royak et al. | |
| 2009/0273308 A1 | 11/2009 | Matsuo | |
| 2010/0188033 A1 | 7/2010 | Daboussi et al. | |

OTHER PUBLICATIONS

The International Search Report and the Written Opinion of the International Searching Authority, dated Jul. 13, 2012 (16 pages).

(Continued)

*Primary Examiner* — John Breene
*Assistant Examiner* — Manuel Rivera Vargas
(74) *Attorney, Agent, or Firm* — Harness, Dickey & Pierce, P.L.C.

(57) ABSTRACT

One embodiment of the method includes setting up a testing architecture where the testing architecture includes a test IPM machine having an output shaft coupled to an output shaft of a secondary speed control machine. The method further includes controlling the secondary speed control machine to drive the output shaft of the test IPM machine at a first desired speed, determining a pair of desired direct and quadrature axis currents for each of a plurality of peak current magnitudes, and recording characterization data associated with each pair of desired direct and quadrature axis currents. The controlling, determining and recording steps for each of a second through nth desired speeds may be repeated. Control lookup tables for operation of an IPM machine may be generated from the characterization data.

26 Claims, 5 Drawing Sheets

(56) References Cited

OTHER PUBLICATIONS

M.E. Hague et al., "Improved Trajectory Control for an Interior Permanent Magnet Synchronous Motor Drive With Extended Operating Limit" School of Electrical Engineering and Telecommunication, University of New South Wales, Sydney, Australia, whole document.

J.L. Kirtley Jr., "Class Notes Chapter 12: Permanent Magnet "Brushless DC" Motors" 6.061 Introduction to Power Systems, Massachusetts Institute of Technology, Department of Electrical Engineering and Computer Science, Feb. 5, 2003, whole document.

M. Elbuluk and M. Kankam, "Speed Sensorless Induction Motor Devices for Electrical Actuators: Schemes, Trends and Tradeoffs," National Aerospace and Electronics Conference cosponsored by IEEE, Wright-Patterson AFB, Dayton, OH, Jul. 14-18, 1997.

S. Van Haute et al., "Design and Control of a Permanent Magnet Synchronous Motor Drive for a Hybrid Electric Vehicle," Katholieke University Leauven, Belgium.

US 7,595,604, 09/2009, Tomigashi (withdrawn)

\* cited by examiner

METHOD AND APPARATUS FOR CHARACTERIZING AN INTERIOR PERMANENT MAGNET MACHINE

BACKGROUND

Alternating current (ac) machines (e.g., IPM machines) are extensively used in loaders, combines or other heavy equipment machinery vehicle electric drive because they provide a higher efficiency than direct current (dc) machines. Of the ac machines, an Interior Permanent Magnet (IPM) machine has high drive efficiency and a wider constant power operating range. An IPM machine controller also called an inverter, controls operation of the IPM machine. The controller produces ac control signals which are applied to the terminals of the IPM machine. Typically the controller controls the IPM machine based on information or a portion of information characterizing the IPM machine. At least part of the characterization refers to the operational model of the IPM machine that permits translation of input requests into desired operational output. For example, a desired output torque may be requested, and based on part of the characterization, the controller controls the IPM machine to deliver the desired torque.

SUMMARY

Embodiments relate to a method and/or apparatus for characterizing an IPM machine.

One embodiment of the method includes setting up a testing architecture where the testing architecture includes a test IPM machine having an output shaft coupled to an output shaft of a secondary machine. The method further includes controlling the secondary machine to drive the output shaft of the test IPM machine at a first desired speed, determining a pair of desired direct and quadrature axis currents for each of a plurality of peak current magnitudes, and recording characterization data associated with each pair of desired direct and quadrature axis currents. The controlling, determining and recording steps for each of a second through nth desired speeds may be repeated. Control lookup tables for operation of an IPM machine may be generated from the characterization data.

In some embodiments, the determining step, for each peak current magnitude, includes applying the peak current magnitude and a series of current angles to a controller for the test IPM machine. Each current angle indicates amounts of the peak current magnitude appearing as the direct axis current and the quadrature axis current.

In some embodiments, the applying step includes adjusting the current angle until a desired torque is produced by the first output shaft.

In some embodiments, the desired torque is a maximum torque.

In some embodiments, the desired torque is a maximum torque for which a limit on terminal-to-terminal voltage of the test IPM machine is not exceeded.

In some embodiments, the applying step applies the peak current magnitudes and the current angles such that current applied to the test IPM machine remains below a current limit.

In some embodiments, the applying step applies successively higher peak current magnitudes until one of a desired torque is obtained, torque produced by the output shaft decreases, current applied to the test IPM machine will exceed a current limit, and a terminal-to-terminal voltage of the test IPM machine will exceed a voltage limit.

In some embodiments, the applying step includes measuring the torque produced by the first output shaft.

In some embodiments, the applying step includes calculating the torque produced by the first output shaft based on at least one of power supplied to the test IPM machine and power generated from the secondary speed control machine.

In some embodiments, the applying step applies the peak current magnitudes such that current applied to the test IPM machine does not exceed a current limit, and a terminal-to-terminal voltage of the test IPM machine does not exceed a voltage limit.

In some embodiments, the characterization data includes torque generated by the first output shaft for each pair of desired direct and quadrature axis currents.

In some embodiments, the characterization data further includes efficiency of the test IPM machine and power electronics losses associated with the test machine controller.

In some embodiments, the characterization data includes, for each pair of desired direct and quadrature axis currents, at least one of torque generated by the first output shaft, dc bus voltage of power supplied to the test architecture, shaft speed of the first output shaft.

In some embodiments, the method further includes performing curve fitting on the characterization data.

In some embodiments, the method further includes generating at least one control lookup table based on output from the performing step.

In some embodiments, the control lookup table provides maximum torque generated by the first output shaft for an associated ratio, the associated ratio being the dc bus voltage divided by the shaft speed associated with the maximum torque.

In some embodiments, the control lookup table provides the direct axis current for an associated torque percentage and associated ratio. The associated ratio is the dc bus voltage divided by the shaft speed associated with the direct axis current, and the associated torque percentage is based on the torque generated by the first output shaft for the direct axis current and a maximum torque generated by the first output shaft at the shaft speed associated with the direct axis current.

In some embodiments, the control lookup table provides the quadrature axis current for an associated torque percentage and associated ratio. The associated ratio is the dc bus voltage divided by the shaft speed associated with the quadrature axis current, and the associated torque percentage is based on the torque generated by the first output shaft for the quadrature axis current and a maximum torque generated by the first output shaft at the shaft speed associated with the quadrature axis current.

In some embodiments, prior to the controlling step, the method further includes placing the test IPM machine in a desired operation state based on one of the first to nth desired shaft speed.

In some embodiments, the placing step applies a zero peak current magnitude and a zero current angle to the test machine controller if the one of the first to nth desired shaft speeds is equal to or below a critical speed for the test IPM machine, the current angle indicating amounts of the peak current magnitude appearing as the direct axis current and the quadrature axis current.

In some embodiments, the placing step applies a desired peak current magnitude and a 90 degree current angle to the test machine controller if the one of the first to nth desired shaft speeds is above a critical speed for the test IPM machine.

In some embodiments, the test IPM machine is in one of a motoring mode and a generation mode.

At least one embodiment is directed to a machine controller having control look-up tables according to any of the embodiments.

At least one embodiment is directed to computer readable medium storing control look-up tables according to according to any of the embodiments.

At least one embodiment is directed to a controller for controlling an interior permanent magnet (IPM) machine. For example, the controller may include a memory configured to store control look-up tables according to any of the embodiments, and a processor configured to control the IPM machine based on the look-up tables.

BRIEF DESCRIPTION OF THE DRAWINGS

The example embodiments will become more fully understood from the detailed description given herein below and the accompanying drawings, wherein like elements are represented by like reference numerals, which are given by way of illustration only and thus are not limiting of the example embodiments and wherein.

DETAILED DESCRIPTION OF EXAMPLE EMBODIMENTS

Figure 1:
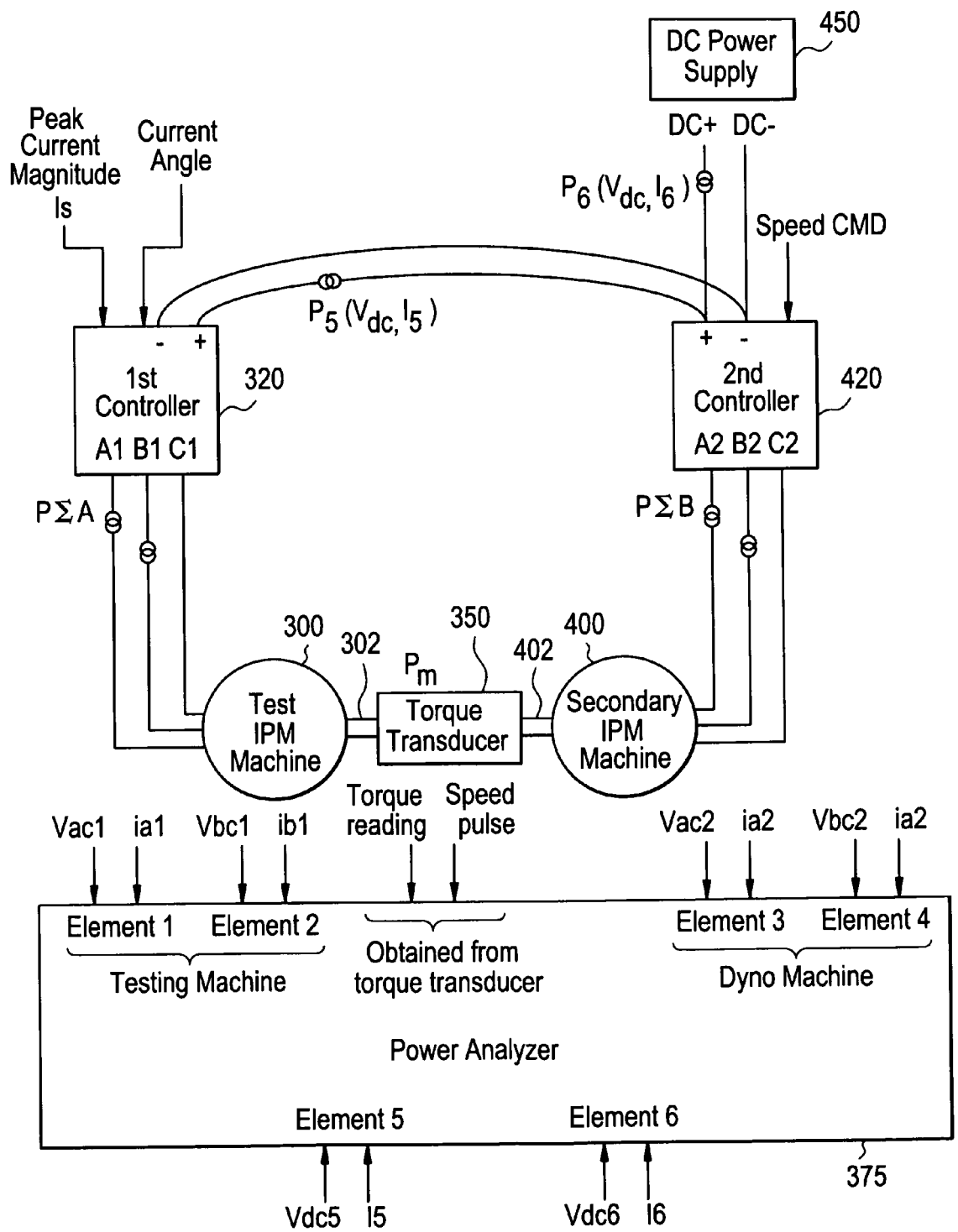
FIG. 1 illustrates a testing architecture according to an embodiment.

Detailed illustrative embodiments are disclosed herein. However, specific structural and functional details disclosed herein are merely representative for purposes of describing example embodiments. An embodiment may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term in "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are discussed herein as being implemented in a suitable computing environment. Although not required, exemplary embodiments will be described in the general context of computer-executable instructions, such as sections, program modules or functional processes, being executed by one or more computer processors or CPUs. Generally, sections, program modules or functional processes include routines, programs, objects, components, data structures, etc. that performs particular tasks or implement particular abstract data types. The sections, program modules and functional processes discussed herein may be implemented using existing hardware in existing communication networks. For example, sections, program modules and functional processes discussed herein may be implemented using existing hardware at existing network elements, servers or control nodes. Such existing hardware may include one or more digital signal processors (DSPs), application-specific-integrated-circuits, field programmable gate arrays (FPGAs) computers or the like.

In the following description, illustrative embodiments will be described with reference to acts and symbolic representations of operations (e.g., in the form of flowcharts) that are performed by one or more processors, unless indicated otherwise. As such, it will be understood that such acts and operations, which are at times referred to as being computer-executed, include the manipulation by the processor of electrical signals representing data in a structured form. This manipulation transforms the data or maintains it at locations in the memory system of the computer, which reconfigures or otherwise alters the operation of the computer in a manner well understood by those skilled in the art.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a testing architecture according to an embodiment. As shown, the testing architecture includes a test IPM machine 300 having a first shaft 302 that the test IPM machine 300 rotates in response to control signals. For example, the test IPM machine 300 may be an interior permanent magnet (IPM) machine (e.g., motor or generator depending on operating mode), synchronous IPM machine, etc. The test IPM machine 300 includes three real terminals A1, B1 and C1 each receiving a respective alternating current (ac) control signal. The testing architecture also includes a secondary IPM machine 400 having a second shaft 402 coupled to the first shaft 302 by a torque transducer 350. The secondary IPM machine 400 is not limited to being an IPM machine, and may be any machine capable of maintaining the first shaft 302 at a constant speed. Furthermore, if the second IPM machine 400 is an IPM machine, the secondary IPM machine 400 may be the same as the test IPM machine 300 as shown in FIG. 1. Accordingly, the secondary IPM machine 400 includes three real terminals A2, B2 and C2 each receiving a respective alternating current (ac) control signal. While a torque transducer 350 connects the test IPM machine 300 and the secondary IPM machine 400, optionally, the second shaft 402 may be directly coupled to the first shaft 302, or the two shafts may be coupled in other ways known in the art.

A first controller 320, sometimes referred to as an inverter, controls operation of the test IPM machine 300. Similarly, a second controller 420 controls operation of the secondary IPM machine 400. The first and second controller 320 and 420 may be the same, and may be any well-known or commercially available controller for IPM machines. For example, the first controller 320 supplies the control signals to the terminals A1, B1 and C1 of the test IPM machine 300, and the second controller 420 supplies control signals to terminal A2, B2 and C2 of the secondary IPM machine 400. A power supply 450 supplies direct current (dc) power to both the first and second controllers 320 and 420. The power supply 450 may be a battery, a generator, etc.

As shown, commands may be applied to the first and second controllers 320 and 420 to in-turn control operation of the test and secondary IPM machines 300 and 400. FIG. 1 illustrates the first controller 320 receiving a peak current magnitude and current angle command, and illustrates the second controller 420 receiving a speed command. These commands and the operation of the controllers 320 and 420 will be described in greater detail below.

The testing architecture further includes a power analyzer 375. FIG. 1 illustrates a single power analyzer 375 having six test elements. However, instead of a single power analyzer, more than one power analyzer, each with fewer than six test elements may be used instead. As shown, the first test element1 measures the voltage Vac1 between terminals A1 and C1 and the current ia1 at terminal A1; the second test element2 measures the voltage Vbc1 between terminals B1 and C1 and the current at terminal B1; the third test element3 measures the voltage Vac2 between terminals A2 and C2 and the current ia2 at terminal A2; the fourth test element4 measures the voltage Vbc2 between terminals B2 and C2 and the current at terminal B2; the fifth test element5 measures the dc bus voltage VdcS and the dc current I5 input to the first controller 320; and the sixth test element6 measures the dc bus voltage Vdc6 and the current I6 output from the power supply 450 (e.g., to the second controller 420). Optionally, the power analyzer 375 or an additional power analyzer could also measure the voltage Vab1 between terminals A1 and B1, current ic1 received at terminal C1, voltage Vab2 between terminals A2 and B2, and current ic2 received at terminal C2 if more test elements in power analyzer are available.

From the above input measurement data, the power analyzer 375 is configured to measure the terminal real power Pa of the test IPM machine 300 (e.g., detected real power based on terminal voltages and currents at terminals A1 and B1), the terminal real power Pb of the secondary IPM machine 400 (e.g., detected real power based on terminal voltages and currents at terminals A2 and B2), the dc power P5 input to the first controller 320, and the dc power P6 output from the power supply 450. The power analyzer 375 also receives the torque reading and shaft speed measurement from the torque transducer 350.

From the power measurement data, the power analyzer 375 is configured to produce the following operating data:

Pm=(Pa−Pb)/2, where Pm is the mechanical power on the shaft 302 of the test IPM machine 300;

Pinv1=P5−Pa, where Pinv1 is the power electronics losses in the first controller 320;

Palltest=PA−Pm, where Palltest represents all test IPM machine 300 losses including copper, iron, friction, windage, etc;

Po2=P6−P5, where Po2 is the power output from the second controller 420 towards the first controller 320;

Pinv2=Pb−(Po2), wherein Pinv2 is the power electronics losses in the second controller 420;

Pallsecond=Pm−Pb, where Pallsecond represents all secondary IPM machine 400 losses including copper, iron, friction, windage, etc; and Tshaft=Pm/SS, where Tshaft is the calculated shaft torque for shaft 302 of the test IPM machine 300, and SS is the shaft speed of the shaft 302 output by the torque transducer 350.

Efficiency of the test IPM machine 300 may be determined from the above measurements as Ttesteff=Pm/Pa assuming the test IPM machine 300 is running in motoring mode. Similarly, the efficiency of the secondary IPM machine 400 may be determined from the above measurements as Tsecondeff=Pb/PM assuming the second machine is running in generating mode. The input data (dc bus voltage, peak current magnitude, current angle, desired shaft speed, etc.), the measurement data (terminal voltage, current, power, etc.) and operating data (mechanical power, losses, torque, efficiency, etc.) are collectively referred to as the characterization data.

Next, characterizing the test IPM machine using the above-described testing architecture will be described in detail. However, a few design limitations/considerations will be discussed to promote a clearer understanding of the characterization processes.

Torque control of IPM machines generally involves generating alternating current (AC or ac) control signals for controlling the IPM machine based on the requested torque. Typically the AC control signals are represented by a current vector having a peak current magnitude Is and current angle G. The current vector is often represented by a direct axis current id or Id component and quadrature axis current iq or Iq component of the current vector where:

$Id = -Is \cos G$, and $Iq = Is \sin G$.

Id component is negative in IPM machine control while the sign of Iq component depends on the sign of the desired torque.

Generation of the ac control signals is constrained by operational constraints associate with the IPM machine. For example, the ac control signals, which power stator windings in the IPM machine, have current limits to prevent damage to the IPM machine such as from overheating, etc. The current limits are generally predicated by the design of the IPM machine and/or power switch thermal rating in the corresponding controller, and are known a priori to any characterization procedure.

Similarly, there exist voltage limits on the ac control signals to prevent the controller and IPM machine from entering into a detrimental operating mode. As is well-known, the theoretical maximum fundamental voltage (peak value) in linear modulation range is:

$$\hat{V}_{fund\_max} = \frac{V_{dc}}{\sqrt{3}}$$

where Vdc is the voltage supplied by a power supply (e.g., power supply 450) to the IPM machine controller.

For the purpose of generating more torque output with a given current level, we want to utilize available voltage as much as possible. However, to set the voltage limit to that theoretical boundary may be impractical because of manufacturing and usage variances. Accordingly, in the example embodiments, a coefficient $n$ between 0.90 and 0.95 is incorporated when determining the voltage limit during the characterization stage. The limit for IPM machine terminal phase-to-phase fundamental component root-mean-squared (rms) voltage is set as:

$$V_{LL\_rms\_lim} = \frac{V_{dc}}{\sqrt{3}} \cdot \eta \cdot \frac{\sqrt{3}}{\sqrt{2}} = \frac{V_{dc}}{\sqrt{2}} \cdot \eta$$

The selection of η is application dependent, and is determined through empirical study. As a first trial, η=0.93 is often a good choice. During the characterization procedure, the phase-to-phase terminal voltage fundamental rms values (or, alternatively, rectified mean voltage measurement values from power analyzer) for Vac1 and Vbc1 are monitored. As will be appreciated, this may also be monitored for Vab1, as well as the same respective voltages for the secondary IPM machine 400. The highest monitored phase-to-phase fundamental rms voltage for the test IPM machine 300 should be kept just barely below the preset voltage limit, $V_{LL\_rms\_lim}$, while tuning the current angle.

Lastly, based on the design of an IPM machine, the IPM machine will have a known base speed and critical speed. These speeds refer to the rotational speed of the IPM machine or output shaft of the IPM machine. The base speed is a maximum output shaft speed at which maximum constant shaft torque is achieved. The critical speed is a transition speed where the uncontrolled generation (UCG) voltage from backemf starts to exceed the supply dc bus voltage Vdc.

Next, low speed and high speed characterization procedures will be described. Low speed refers to shaft speeds at or below the base speed, and high speed refers to shaft speeds above the base speed.

Figure 2:
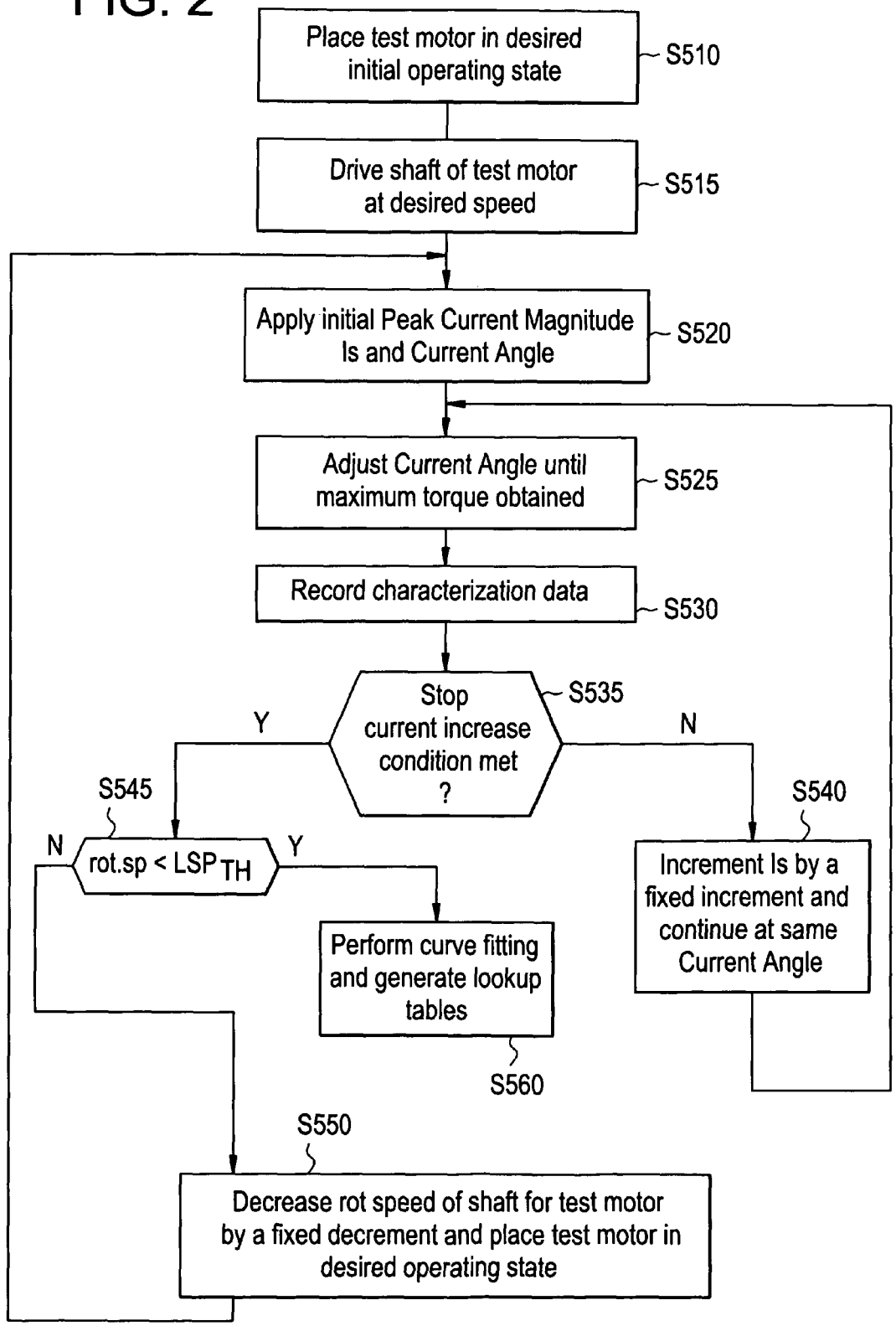
FIG. 2 illustrates a flow chart of the low speed characterization procedure.

FIG. 2 illustrates a flow chart of the low speed characterization procedure. The procedure of FIG. 2 is performed while maintaining the dc voltage output from the power supply 450 stable. As shown, in step S510, the test IPM machine 300 is placed in a desired initial operation state. For example, commands for a zero peak current magnitude Is and zero current angle G may be applied to the first controller 320 in step S510. For the purposes of discussion, steps such as step S510 will be described as if performed by a human operator. However, it will be appreciated that a test computer may be used to apply each of the commands instead of this manual application. By applying a zero peak current magnitude and zero current angle, the direct and quadrature currents id and iq will both be zero as well.

Next, in step S515, the secondary IPM machine 400 is controlled to drive the shaft 302 of the test IPM machine 300 at a first desired speed. For example, a speed command may be applied to the second controller 420, and in response, the second controller 420 controls the secondary IPM machine 400 to drive shaft 402 at the commanded speed. In return, this drives the shaft 302 of the test IPM machine 300 via the torque transducer 350 such that the shaft 302 rotates at the first desired speed. The first desired speed may be the base speed of the test IPM machine 300. As will be recalled, the base speed is generally known based on the design of the test IPM machine 300. Alternatively, the base speed may be empirically determined.

In step S520, commands for a first peak current magnitude and 90 degree current angle may be applied to the first controller 320. The first peak current magnitude may be 30 A for example. Then, in step S525, the current angle is adjusted until the current angle producing the maximum torque at the first shaft 302 of the test IPM machine 300 is determined. The current angle producing maximum torque for the peak current magnitude may be determined in several ways. For example, the torque reading output from the torque transducer 350 may be monitored to determine which angle produces the maximum reading. As another example, the terminal real power Pa may be monitored. The terminal real power Pa is directly related to torque such that the current angle producing the maximum value of the terminal real power Pa substantially corresponds to the current angle producing the maximum torque.

In step S530, the characterization data discussed above are recorded. In particular, certain measurement or operating data may be recorded in association with certain input data. For example, the maximum torque may be recorded in association with the shaft speed, the dc voltage output from the power supply 450, and the direct and quadrature currents id and iq represented by the peak current magnitude and current angle producing the maximum torque. The maximum torque, for example, may be the output from the torque transducer or the calculated torque Tshaft.

Whether a condition indicating to stop increasing the peak current magnitude exists is determined in step S535. A first condition is whether an increase would cause the peak current magnitude to exceed the current limit (discussed above). A second condition may be whether a maximum desired torque has been reached. Typically with IPM machine design, one of the design parameters or considerations is the IPM machine be able to produce certain levels of torque at various shaft speeds. Once a desired maximum torque has been achieved, increasing the peak current magnitude to achieve higher levels of torque is not necessary, but may be performed.

If the determination in step S535 is negative, then in step S540, commands for a next peak current magnitude may be applied to the first controller 320. The next peak current magnitude may be the previous peak current magnitude incremented by a fixed increment. The fixed increment may be 30 A for example. As to the current angle, this may remain unchanged from the present current angle. The procedure then returns to step S525.

If the determination in step S535 is positive, then the data gathering portion of the low speed characterization procedure for the desired speed is complete. Whether the desired speed is less than a low speed threshold is determined in step S545. The low speed threshold may be set such that the desired speed is not decreased below a desired minimum speed. If the determination in step S545 is negative, then in step S550, commands for a next desired speed may be applied to the second controller 420. The next desired speed may be a fixed decrement less than the current desired speed. For example, the fixed decrement may be 500 rpm. Also, in step S550, the test IPM machine 300 is placed in the desired initial operating state as described above with respect to step S510. The characterization procedure then returns to step S520 to generate the characterization for this new desired speed. As will be appreciated, before proceeding with the characterization of the test IPM machine 300 at the new desired speed, operation of the test IPM machine 300 may be shut down to allow the test IPM machine 300 to cool down to a desired temperature (e.g., ambient air temperature or preset cooling oil temperature).

If the result of step S545 is positive, then in step S560, curve fitting is performed and various look-up tables may be generated. Curve fitting may be performed on the characterization data for the rotation speeds tested in the above procedure. As will be appreciated, the recorded characterization data for each rotation speed provides discrete peak current magnitudes and associated characterization data at each peak current magnitude. By using well-known curve fitting techniques, characterization data for a continuous range of peak current magnitudes may be generated for each rotation speed. Curve fitting may be applied to any related sets of characterization data to produce x-dimensional lookup tables, where x is number of different types of characterization data.

The generation of a number of control lookup tables will be described for the sake of clarity, but it will be understood that any number of look-up tables may be generated.

The first example control lookup table relates shaft speed to peak or maximum torque. Here, the set of operating points includes the different tested shaft speeds and the maximum torque produced at each shaft speed. Curving fitting produces a continuous set of shaft speeds each mapping to a maximum torque value. This map may be stored as a lookup table such that input of a shaft speed results in output of a maximum torque value.

The second example lookup table is the same as the first example control lookup table except that the shaft speeds are replaced with ratios. Each ratio is the dc bus voltage divided by one of tested shaft speed. The dc bus voltage is the dc voltage output by the power supply 450 during characterization. Because a stable power supply is used, the dc bus voltage should be the same for each speed. Namely, dividing the dc bus voltage by each shaft speed in the first lookup table produces the second lookup table. Alternatively, the curve fitting may be performed on the ratio values to generate the second lookup table. As will be appreciated, a uniform coefficient may be applied to each of the ratio values in the second lookup table.

The third example control lookup table relates shaft speed, torque and direct axis current. As will be recalled, for each peak magnitude current tested at a particular shaft speed, a maximum torque value was recorded and the current angle associated with the maximum torque value was recorded. Accordingly, each maximum torque value is associated with a pair of direct axis current and quadrature axis current values. For each shaft speed, curving fitting may be performed on a set of operating points that include the torque value and the associated direct axis current value. This curve fitting produces a sub-lookup table also called a page for each shaft speed, and the collection of pages forms the overall lookup table. This lookup table may be used to generate the direct axis current in response to input shaft speed and torque values.

The fourth control lookup table is the same as the third control lookup table except that the shaft speeds are replaced with ratios. Each ratio is the dc bus voltage divided by one of the shaft speeds as discussed above with respect to the second control lookup table. As will be appreciated, a uniform coefficient may be applied to each of the ratio values.

The fifth control lookup table is the same as the third control lookup table except that the torque is replaced with a torque percentage. Here, the maximum torque generated at a shaft speed is treated as 100% torque, and each lower torque value is converted to a percentage based on that maximum torque (e.g., 100*torque/max torque). This conversion may be performed prior to curve fitting.

The sixth control look up table is the same as the fourth control lookup table except that the torque is replaced with a torque percentage. Here, the maximum torque generated at shaft speed is treated as 100% torque, and each lower torque value is converted to a percentage based on that maximum torque (e.g., 100*torque/max torque). This conversion may be performed prior to curve fitting. Each of the third through sixth control lookup tables may generate direct axis current in response to the appropriate inputs.

The seventh through tenth control lookup tables are the same as the third through sixth control lookup tables except that these lookup tables are based on quadrature axis current instead of direct axis current.

As will be appreciated, numerous variations in the above described characterization procedure are possible. For example, instead of performing testing from a base speed and decrementing from this initial speed, the procedure may be performed in reverse. For example, testing may start at a desired low speed, and then each subsequent test is performed at an incrementally higher speed until reaching the base speed. Still further, the speeds at which the test IPM machine 300 is characterized may be chosen randomly.

Next a high speed characterization procedure will be described.

Figure 3:
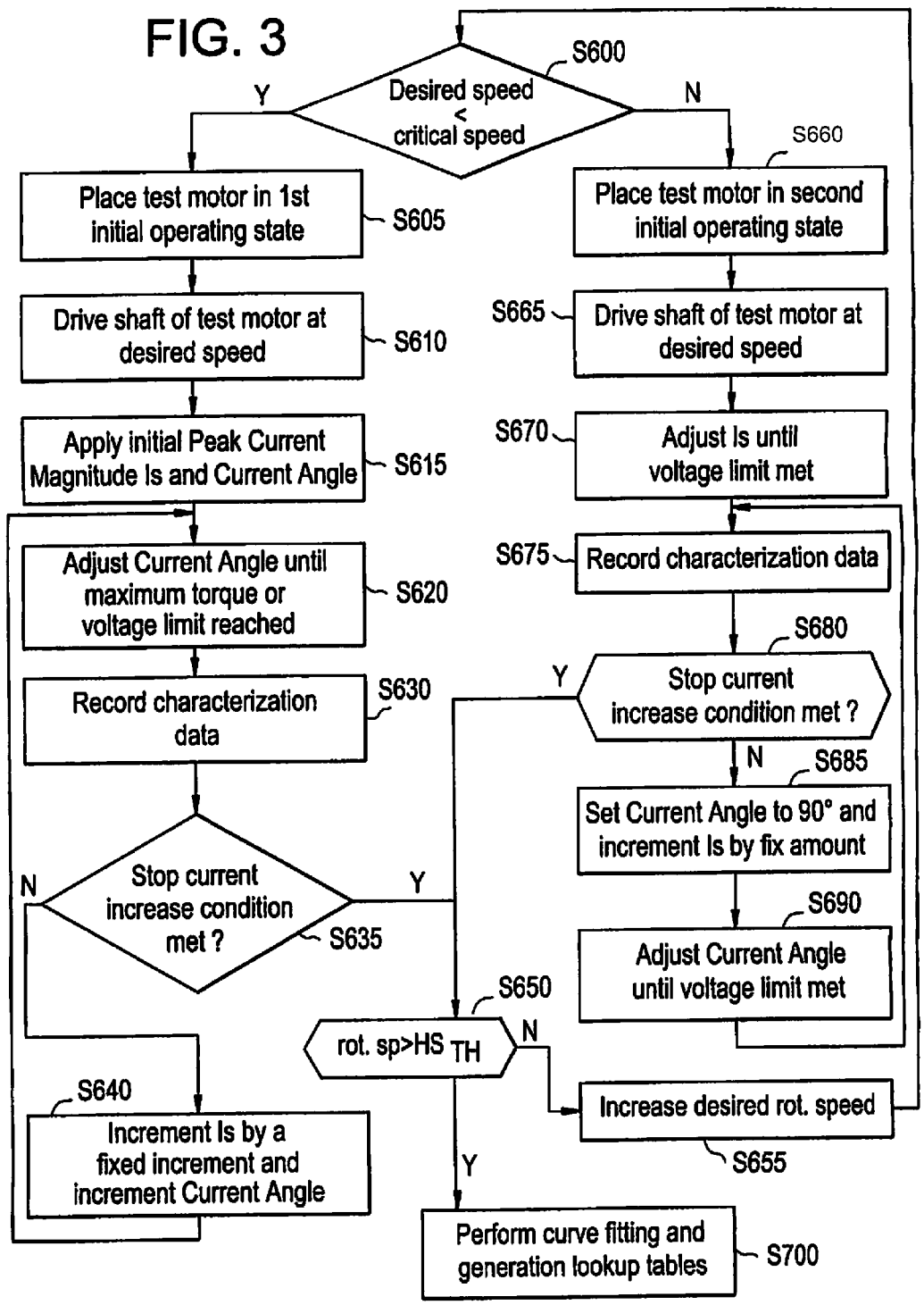
FIG. 3 illustrates a flow chart of the high speed characterization procedure.

FIG. 3 illustrates a flow chart of the high speed characterization procedure. The procedure of FIG. 3 is performed while maintaining the dc bus voltage output from the dc power supply 450 stable. As shown, in step S600, a determination is made as to whether the desired test speed is less than the critical speed. For the initial iteration, the initial desired test speed may be a fixed increment (e.g., 200 rpm) above the base speed. Also, the critical speed is known based on the design of the IPM machine or may be empirically determined.

If the result of step S600 is positive, the test IPM machine 300 is placed in a first initial operating state in step S605. For example, commands for a zero peak current magnitude and a zero degree current angle may be applied to the first controller 320 in step S605. For the purposes of discussion, steps such as step S605 will be described as if performed by a human operator. However, it will be appreciated that a test computer may be used to apply each of the commands instead of this manual application.

Next, in step S610, the secondary IPM machine 400 is controlled to drive the shaft 302 of the test IPM machine 300 at a first desired speed. For example, a speed command may be applied to the second controller 420, and in response, the second controller 420 controls the secondary IPM machine 400 to drive shaft 202 at the commanded speed. In return, this drives the shaft 302 of the test IPM machine 300 via the torque transducer 350 such that the shaft 302 rotates at the first desired speed. As discussed above, the first desired speed may be 200 rpm above the base speed of the test IPM machine 300.

In step S615, commands for a first peak current magnitude and 90 degree current angle may be applied to the first controller 320. The first peak current magnitude may be 30 A for example. Then, in step S620, the current angle is adjusted until the current angle producing the maximum torque at the first shaft 302 of the test IPM machine 300 is determined or the voltage limit is reached. The current angle producing maximum torque for the peak current magnitude may be determined in several ways. For example, the torque reading output from the torque transducer 350 may be monitored to determine which angle produces the maximum reading. As another example, the terminal real power Pa may be monitored. The terminal real power Pa is directly related to torque such that the current angle producing the maximum value of the terminal real power Pa substantially corresponds to current angle producing the maximum torque. The power analyzer 375 also monitors the terminal to terminal voltage Vac1 and Vbc1. If either of these voltages reach the voltage limit, then the current angle is adjusted so that the monitored voltage is just barely under (e.g., 100 mV) the voltage limit.

In step S630, the characterization data discussed previously are recorded. In particular, certain measurement or operating data may be recorded in association with certain input data. For example, the maximum obtained torque may be recorded in association with the shaft speed, the dc bus voltage output from the power supply 450, and the direct and quadrature axis currents id and iq represented by the peak current magnitude and current angle established in step S620.

The maximum obtained torque, for example, may be the output from the torque transducer or the calculated torque Tshaft.

Whether a condition indicating to stop increasing the peak current magnitude exists is determined in step S635. A first condition is whether an increase would cause the peak current magnitude to exceed the current limit (discussed above). A second condition may be whether a maximum desired torque has been reached. Typically with IPM machine design, one of the design parameters or considerations is the IPM machine be able to produce certain levels of torque at various shaft speeds. Once a desired maximum torque has been achieved, increasing the peak current magnitude to achieve higher levels of torque is not necessary, but may be performed. A third condition is that shaft torque has decreased compared to the previous, lower peak current magnitude.

If the determination in step S635 is negative, then in step S640, commands for a next peak current magnitude may be applied to the first controller 320. The next peak current magnitude may be the previous peak current magnitude incremented by a fixed increment. The fixed increment may be 30 A for example. As to the next current angle, this may be incremented a few degrees (e.g., 2-5 degrees) from the present current angle to prevent exceeding voltage limit for the first placement of the next peak current magnitude. The next current angle can be applied before or simultaneously with the next peak current magnitude. The procedure then returns to step S620.

If the determination in step S635 is positive, then the data gathering portion of the characterization procedure for the desired speed is complete. Whether the desired speed is greater than a high speed threshold is determined in step S650. The high speed threshold may be set such that the desired speed is not increased above a desired maximum shaft speed. If the determination in step S650 is negative, then in step S655, the desired rotation speed is increased by a fixed increment. For example, the fixed increment may be 200 rpm.

The characterization procedure then returns to step S600 to generate the characterization for this new desired speed. As will be appreciated, before proceeding with the characterization of the test IPM machine 300 at the new desired speed, operation of the test IPM machine 300 may be shut down to allow the test IPM machine 300 to cool down to a desired temperature (e.g., ambient air temperature or preset cooling oil temperature).

If the determination in step S650 is positive, then the characterization procedure proceeds to step S700 discussed in detail below after the following discussion of step S660-S690.

Returning to step S600, if the determination in this step is negative, then the test IPM machine 300 will be operating at or above the critical speed. In step S660, the test IPM machine 300 is placed in a second initial operating state. For example, commands for a high peak current magnitude (e.g., 100 A) and a ninety degree current angle may be applied to the first controller 320 in step S660.

Next, in step S665, the secondary IPM machine 400 is controlled to drive the shaft 302 of the test IPM machine 300 at the desired speed. For example, a speed command may be applied to the second controller 420, and in response, the second controller 420 controls the secondary IPM machine 400 to drive shaft 402 at the commanded speed. In return, this drives the shaft 302 of the test IPM machine 300 via the torque transducer 350 such that the shaft 302 rotates at the desired speed.

In step S670, the peak current magnitude is adjusted until the voltage limit is met. This produces a base operating point from which to complete the characterization of the test IPM machine 300 at the present desired speed. In step S675, the characterization data is recorded for this operating point. In particular, certain measurement or operating data may be recorded in association with certain input data. For example, the present torque may be recorded in association with the shaft speed, the dc bus voltage output from the power supply 450, and the direct and quadrature axis currents id and iq represented by the peak current magnitude and current angle producing the torque. The torque, for example, may be the output from the torque transducer or the calculated torque Tshaft.

Whether a condition indicating to stop increasing the peak current magnitude exists is determined in step S680. A first condition is whether an increase would cause the peak current magnitude to exceed the current limit (discussed above). As will be appreciated, the current limit at higher shaft speeds may be dependent on the PWM switching frequency used to limit losses in the first controller 320. A second condition may be whether a maximum desired torque has been reached. Typically with IPM machine design, one of the design parameters or considerations is the IPM machine be able to produce certain levels of torque at various shaft speeds. Once a desired maximum torque has been achieved, increasing the peak current magnitude to achieve higher levels of torque is not necessary, but may be performed. A third condition is that shaft torque has decreased compared to the previous, lower peak current magnitude. These are the same conditions as discussed above with respect to step S635.

If the determination in step S680 is negative, then in step S685, commands for a next peak current magnitude may be applied to the first controller 320. The next peak current magnitude may be the previous peak current magnitude incremented by a fixed increment. The fixed increment may be 30 A for example. As to the current angle, this may be varied a few degrees (e.g., 2-5 degrees) from the present current angle to prevent exceeding voltage limit for the first placement of the next peak current magnitude. The next current angle can be applied before or simultaneously with the next peak current magnitude. Then, the current angle is adjusted until the voltage limit is barely under (e.g. 100 mV) the voltage limit in step S690. At this point the procedure returns to step S675.

If the determination in step S680 is positive, then the data gathering portion of the characterization procedure for the desired speed is complete, and then proceeds to step S650

If the result of step S650 is positive, then in step S700, curve fitting is performed and various look-up tables may be generated. The curve fitting and generated lookup table may be the same as described above with respect to step S560, and therefore will not be repeated for the sake of brevity.

It will be appreciated that the control lookup tables from steps S560 and S700 may be combined. Still further, instead of performing curve fitting and control lookup table generation as separate steps, the characterization data for the procedures of FIGS. 2 and 3 may be combined, and curve fitting and control lookup table generation conducted for the combined characterization data. As will be appreciated, other numerous variations in the above described characterization procedures are possible.

Next, an application of the characterization and in particular, the lookup table generated according to the above described procedures will be described with respect to FIG. 4 below.

Figure 4:
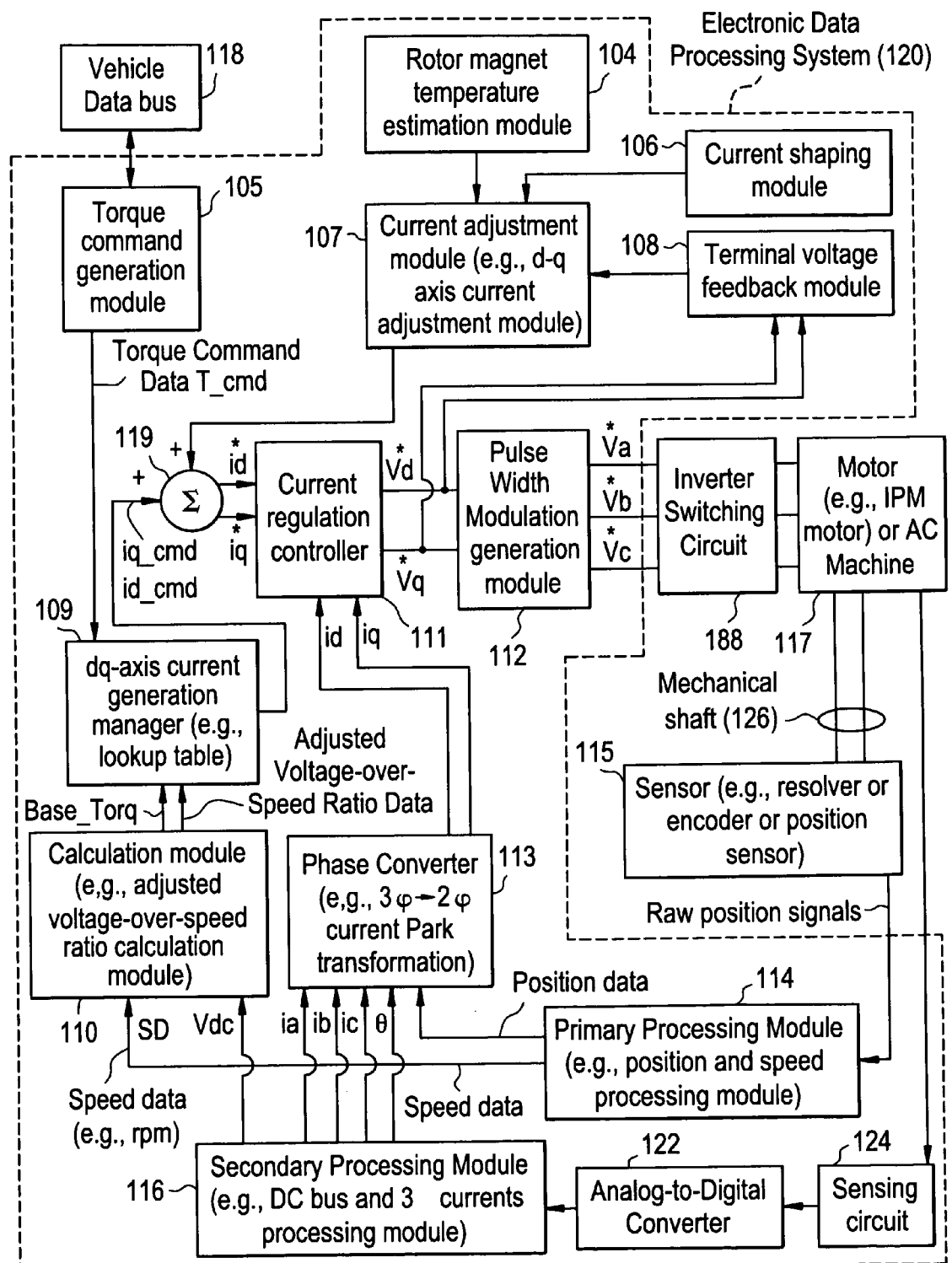
FIG. 4 is a block diagram of one embodiment of a system for controlling an electrical IPM machine.

In accordance with one embodiment, FIG. 4 discloses a system for controlling a IPM machine 117 (e.g., an interior permanent magnet (IPM) IPM machine) or another alternating current machine. In one embodiment, the system, aside from the IPM machine 117, may be referred to as an inverter or a IPM machine controller.

The system comprises electronic modules, software modules, or both. In one embodiment, the IPM machine controller comprises an electronic data processing system 120 to support storing, processing or execution of software instructions of one or more software modules. The electronic data processing system 120 is indicated by the dashed lines in FIG. 4 and is shown in greater detail in FIG. 5.

The data processing system 120 is coupled to an inverter circuit 188. The inverter circuit 188 comprises a semiconductor drive circuit that drives or controls switching semiconductors (e.g., insulated gate bipolar transistors (IGBT) or other power transistors) to output control signals for the IPM machine 117. In turn, the inverter circuit 188 is coupled to the IPM machine 117. The IPM machine 117 is associated with a sensor 115 (e.g., a position sensor, a resolver or encoder position sensor) that is associated with the IPM machine shaft 126 or the rotor. The sensor 115 and the IPM machine 117 are coupled to the data processing system 120 to provide feedback data (e.g., current feedback data, such as $i_a$, $i_b$, $i_c$), raw position signals, among other possible feedback data or signals, for example. Other possible feedback data includes, but is not limited to, winding temperature readings, semiconductor temperature readings of the inverter circuit 188, three phase voltage data, or other thermal or performance information for the IPM machine 117.

In one embodiment, the torque command generation module 105 is coupled to a d-q axis current generation manager 109 (e.g., d-q axis current generation look-up tables) along with an adjusted voltage over speed ratio from the calculation module 110 described in detail below. The d-q axis current generation manager 109 may store any one of the above described combined (i.e., FIGS. 2 and 3) third-sixth control lookup tables and a corresponding one of the combined seventh-tenth control lookup tables. The output of the d-q axis current generation manager 109 and the output of a current adjustment module 107 (e.g., d-q axis current adjustment module 107) are fed to a summer 119. In turn, one or more outputs (e.g., direct axis current data ($i_d^*$) and quadrature axis current data ($i_q^*$)) of the summer 119 are provided or coupled to a current regulation controller 111.

The current regulation controller 111 is capable of communicating with the pulse-width modulation (PWM) generation module 112 (e.g., space vector PWM generation module). The current regulation controller 111 receives respective d-q axis current commands (e.g., $i_d^*$ and $i_q^*$) and actual d-q axis currents (e.g., $i_d$ and $i_q$) and outputs corresponding d-q axis voltage commands (e.g., $v_d^*$ and $v_q^*$ commands) for input to the PWM generation module 112.

In one embodiment, the PWM generation module 112 converts the direct axis voltage and quadrature axis voltage data from two phase data representations into three phase representations (e.g., three phase voltage representations, such as $v_a^*$, $v_b^*$ and $v_c$) for control of the IPM machine 117, for example. Outputs of the PWM generation module 112 are coupled to the inverter 188.

The inverter circuit 188 comprises power electronics, such as switching semiconductors to generate, modify and control pulse-width modulated signals or other alternating current signals (e.g., pulse, square wave, sinusoidal, or other waveforms) applied to the IPM machine 117. The PWM generation module 112 provides inputs to a driver stage within the inverter circuit 188. An output stage of the inverter circuit 188 provides a pulse-width modulated voltage waveform or other voltage signal for control of the IPM machine. In one embodiment, the inverter 188 is powered by a direct current (DC) voltage bus.

The IPM machine 117 is associated with a sensor 115 (e.g., a resolver, encoder, speed sensor, or another position sensor or speed sensors) that estimates at least one of an angular position of the IPM machine shaft 126, a speed or velocity of the IPM machine shaft 126, and a direction of rotation of the IPM machine shaft 126. The sensor 115 may be mounted on or integral with the IPM machine shaft 126. The output of the sensor 115 is capable of communication with the primary processing module 114 (e.g., position and speed processing module). In one embodiment, the sensor 115 may be coupled to an analog-to-digital converter (not shown) that converts analog position data or velocity data to digital position or velocity data, respectively. In other embodiments, the sensor 115 (e.g., digital position encoder) may provide a digital data output of position data or velocity data for the IPM machine shaft 126 or rotor.

A first output (e.g., position data and speed data for the IPM machine 117) of the primary processing module 114 is communicated to the phase converter 113 (e.g., three-phase to two-phase current Park transformation module) that converts respective three-phase digital representations of measured current into corresponding two-phase digital representations of measured current. A second output (e.g., speed data) of the primary processing module 114 is communicated to the calculation module 110 (e.g., adjusted voltage over speed ratio module).

An input of a sensing circuit 124 is coupled to terminals of the IPM machine 117 for sensing at least the measured three-phase currents and a voltage level of the direct current (DC) bus (e.g., high voltage DC bus which may provide DC power to the inverter circuit 188). An output of the sensing circuit 124 is coupled to an analog-to-digital converter 122 for digitizing the output of the sensing circuit 124. In turn, the digital output of the analog-to-digital converter 122 is coupled to the secondary processing module 116 (e.g., Direct current (DC) bus and three phase current processing module). For example, the sensing circuit 124 is associated with the IPM machine 117 for measuring three phase currents (e.g., current applied to the windings of the IPM machine 117, back EMF induced into the windings, or both).

Certain outputs of primary processing module 114 and the secondary processing module 116 feed the phase converter 113. For example, the phase converter 113 may apply a Park transformation or other conversion equations (e.g., certain conversion equations that are suitable are known to those of ordinary skill in the art) to convert the measured three-phase representations of current into two-phase representations of current based on the digital three-phase current data from the secondary processing module 116 and position data from the sensor 115. The output of the phase converter 113 module is coupled to the current regulation controller 111.

Other outputs of the primary processing module 114 and the secondary processing module 116 may be coupled to inputs of the calculation module 110 (e.g., adjusted voltage over-speed ratio calculation module). For example, the primary processing module 114 may provide speed data (e.g., IPM machine shaft 126 revolutions per minute), whereas the secondary processing module 116 may provide a measured level of direct current voltage (e.g., on the direct current (DC) bus of a vehicle). The direct current voltage level on the DC bus that supplies the inverter circuit 188 with electrical energy may fluctuate or vary because of various factors, including, but not limited to, ambient temperature, battery condition, battery charge state, battery resistance or reactance, fuel cell state (if applicable), IPM machine load conditions, respective IPM machine torque and corresponding operational speed, and vehicle electrical loads (e.g., electrically driven air-conditioning compressor). The calculation module 110 is connected as an intermediary between the secondary processing module 116 and the dq-axis current generation manager 109. The output of the calculation module 110 can adjust or impact current commands generated by the d-q axis current generation manager 109 to compensate for fluctuation or variation in direct current bus voltage, among other things. The structure and operation of the calculation module 110 is described in detail in U.S. application Ser. No. 13/036,513 issued as U.S. Pat. No. 8,552,673, entitled "INTERIOR PERMANENT MAGNET MACHINE SYSTEMS AND METHODS FOR CONTROLLING INTERIOR PERMANENT MAGNET MACHINES", filed Feb. 28, 2011 by the inventor of the subject application; the entire contents of which are hereby incorporated by reference.

The rotor magnet temperature estimation module 104, the current shaping module 106, and the terminal voltage feedback module 108 are coupled to or are capable of communicating with the dq-axis current adjustment module 107. In turn, the d-q axis current module 107 may communicate with the dq-axis current generation manager or the summer 119.

The rotor magnet temperature module 104 estimates or determines the temperature of the rotor permanent magnet or magnets. In one embodiment, the rotor magnet temperature estimation module 104 may estimate the temperature of the rotor magnets from, one or more sensors located on the stator, in thermal communication with the stator, or secured to the housing of the IPM machine 117.

In another embodiment, the rotor magnet temperature estimation module 104 may be replaced with a temperature detector (e.g., a thermistor and wireless transmitter like infrared thermal sensor) mounted on the rotor or the magnet, where the detector provides a signal (e.g., wireless signal) indicative of the temperature of the magnet or magnets.

In one embodiment, the method or system may operate in the following manner. The torque command generation module 105 receives an input control data message, such as a speed control data message, a voltage control data message, or a torque control data message, over a vehicle data bus 118. The torque command generation module 105 converts the received input control message into torque control command data 316.

The d-q axis current generation manager 109 selects or determines the direct axis current command data and the quadrature axis current command data associated with respective torque control command data and respective detected IPM machine shaft 126 speed data. For example, the d-q axis current generation manager 109 selects or determines the direct axis current command, the quadrature axis current command by accessing control lookup tables such as combined third-tenth control lookup tables described previously. The sensor 115 on the IPM machine 117 facilitates provision of the detected speed data for the IPM machine shaft 126, where the primary processing module 114 may convert position data provided by the sensor 115 into speed data.

The current adjustment module 107 (e.g., d-q axis current adjustment module) provides current adjustment data to adjust the direct axis current command data and the quadrature axis current command data based on input data from the rotor magnet temperature estimation module 104, the current shaping module 106, and terminal voltage feedback module 108.

The current shaping module 106 may determine a correction or preliminary adjustment of the quadrature axis (q-axis) current command and the direct axis (d-axis) current command based on one or more of the following factors: torque load on the IPM machine 117 and speed of the IPM machine 117, for example. The rotor magnet temperature estimation module 104 may generate a secondary adjustment of the q-axis current command and the d-axis current command based on an estimated change in rotor temperature, for example. The terminal voltage feedback module 108 may provide a third adjustment to d-axis and q-axis current based on controller voltage command versus voltage limit. The current adjustment module 107 may provide an aggregate current adjustment that considers one or more of the following adjustments: a preliminary adjustment, a secondary adjustment, and a third adjustment.

In one embodiment, the IPM machine 117 may comprise an interior permanent magnet (IPM) machine or a synchronous IPM machine (IPMSM). An IPMSM has many favorable advantages compared with conventional induction machines or surface mounted PM machines (SMPM) such as high efficiency, high power density, wide constant power operating region, maintenance free, for instance.

The sensor 115 (e.g., shaft or rotor speed detector) may comprise one or more of the following: a direct current IPM machine, an optical encoder, a magnetic field sensor (e.g., Hall Effect sensor), magneto-resistive sensor, and a resolver (e.g., a brushless resolver). In one configuration, the sensor 115 comprises a position sensor, where position data and associated time data are processed to determine speed or velocity data for the IPM machine shaft 126. In another configuration, the sensor 115 comprises a speed sensor, or the combination of a speed sensor and an integrator to determine the position of the IPM machine shaft.

In yet another configuration, the sensor 115 comprises an auxiliary, compact direct current generator that is coupled mechanically to the IPM machine shaft 126 of the IPM machine 117 to determine speed of the IPM machine shaft 126, where the direct current generator produces an output voltage proportional to the rotational speed of the IPM machine shaft 126. In still another configuration, the sensor 115 comprises an optical encoder with an optical source that transmits a signal toward a rotating object coupled to the shaft 126 and receives a reflected or diffracted signal at an optical detector, where the frequency of received signal pulses (e.g., square waves) may be proportional to a speed of the IPM machine shaft 126. In an additional configuration, the sensor 115 comprises a resolver with a first winding and a second winding, where the first winding is fed with an alternating current, where the voltage induced in the second winding varies with the frequency of rotation of the rotor.

Figure 5:
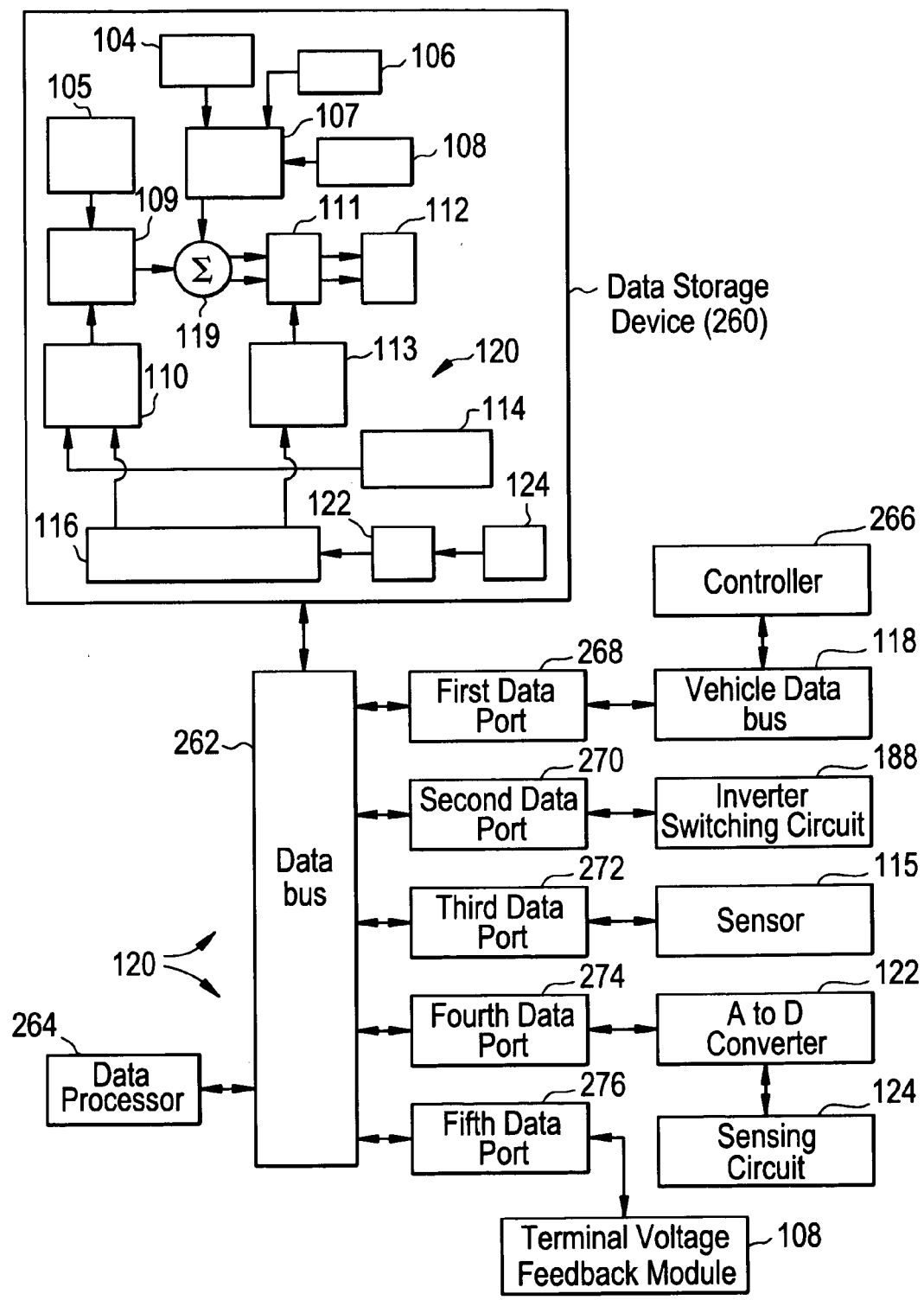
FIG. 5 is a block diagram of an electronic data processing system consistent with FIG. 4.

In FIG. 5, the electronic data processing system 120 comprises an electronic data processor 264, a data bus 262, a data storage device 260, and one or more data ports (268, 270, 272, 274 and 276). The data processor 264, the data storage device 260 and one or more data ports are coupled to the data bus 262 to support communications of data between or among the data processor 264, the data storage device 260 and one or more data ports.

In one embodiment, the data processor 264 may comprise an electronic data processor, a microprocessor, a microcontroller, a programmable logic array, a logic circuit, an arithmetic logic unit, an application specific integrated circuit, a digital signal processor, a proportional-integral-derivative (PID) controller, or another data processing device.

The data storage device 260 may comprise any magnetic, electronic, or optical device for storing data. For example, the data storage device 260 may comprise an electronic data storage device, an electronic memory, non-volatile electronic random access memory, one or more electronic data registers, data latches, a magnetic disc drive, a hard disc drive, an optical disc drive, or the like.

As shown in FIG. 5, the data ports comprise a first data port 268, a second data port 270, a third data port 272, a fourth data port 274 and a fifth data port 276, although any suitable number of data ports may be used. Each data port may comprise a transceiver and buffer memory, for example. In one embodiment, each data port may comprise any serial or parallel input/output port.

In one embodiment as illustrated in FIG. 5, the first data port 268 is coupled to the vehicle data bus 118. In turn, the vehicle data bus 118 is coupled to the controller 266. In one configuration, the second data port 270 may be coupled to the inverter circuit 188; the third data port 272 may be coupled to the sensor 115; the fourth data port 274 may be coupled to the analog-to-digital converter 122; and the fifth data port 276 may be coupled to the terminal voltage feedback module 108. The analog-to-digital converter 122 is coupled to the sensing circuit 124.

In one embodiment of the data processing system 120, the torque command generation module 105 is associated with or supported by the first data port 268 of the electronic data processing system 120. The first data port 268 may be coupled to a vehicle data bus 118, such as a controller area network (CAN) data bus. The vehicle data bus 118 may provide data bus messages with torque commands to the torque command generation module 105 via the first data port 268. The operator of a vehicle may generate the torque commands via a user interface, such as a throttle, a pedal, a controller 266, or other control device.

In certain embodiments, the sensor 115 and the primary processing module 114 may be associated with or supported by a third data port 272 of the data processing system 120.

At least some of the above described embodiments establish a series of operating trajectories throughout the whole operating speed range and torque levels with minimum copper losses in the test machine and controller. At least some of the above described embodiments assure safe and robust IPM machine control within proper current and voltage limits. Still further, at least some embodiments provide dq-axis current controller lookup tables with respect to torque command percentage and ratio. This provides a solid foundation to incorporate additional advanced control features into the controller such as operating the IPM machine with varying dc bus voltage using the adjusted ratio (block 110), current adjustment module (block 107 and 119), etc. The invention being thus described, it will be obvious that the same may be varied in many ways. For example, while the example characterization was described with respect to the test IPM machine operating in a motoring mode (consuming power to driver the output shaft), the characterization may also be performed on the test motor operation in generating mode (generating power based on a driven output shaft). Such variations are not to be regarded as a departure from the invention, and all such modifications are intended to be included within the scope of the invention.

We claim:

1. A method of characterizing an interior permanent magnet (IPM) machine, comprising:
setting up a testing architecture, the testing architecture including a test IPM machine having a first output shaft coupled to a second output shaft of a secondary speed control machine;
controlling the secondary speed control machine to drive the first output shaft of the test IPM machine at a first desired speed;
determining a pair of desired direct and quadrature axis currents for each of a plurality of peak current magnitudes;
recording characterization data associated with each pair of desired direct and quadrature axis currents; and
repeating the controlling, determining and recording steps for each of a second through nth desired speeds.

2. The method of claim 1, wherein the characterization data includes, for each pair of desired direct and quadrature axis currents, at least one of torque generated by the first output shaft, dc bus voltage of power supplied to the test architecture, shaft speed of the first output shaft.

3. The method of claim 2, further comprising:
performing curve fitting on the characterization data.

4. The method of claim 3, further comprising:
generating at least one control lookup table based on output from the performing step.

5. The method of claim 4, wherein the control lookup table provides maximum torque generated by the first output shaft for an associated ratio, the associated ratio being the dc bus voltage divided by the shaft speed associated with the maximum torque.

6. The method of claim 4, wherein the control lookup table provides the direct axis current for an associated torque percentage and associated ratio, the associated ratio being the dc bus voltage divided by the shaft speed associated with the direct axis current, the associated torque percentage being based on the torque generated by the first output shaft for the direct axis current and a maximum torque generated by the first output shaft at the shaft speed associated with the direct axis current.

7. The method of claim 4, wherein the control lookup table provides the quadrature axis current for an associated torque percentage and associated ratio, the associated ratio being the dc bus voltage divided by the shaft speed associated with the quadrature axis current, the associated torque percentage being based on the torque generated by the first output shaft for the quadrature axis current and a maximum torque generated by the first output shaft at the shaft speed associated with the quadrature axis current.

8. The method of claim 4, wherein
a first control lookup table provides maximum torque generated by the first output shaft for an associated ratio, the associated ratio being the dc bus voltage divided by the shaft speed associated with the maximum torque;
a second control lookup table provides the direct axis current for an associated torque percentage and associated ratio, the associated ratio being the de bus voltage divided by the shaft speed associated with the direct axis current, the associated torque percentage being based on the torque generated by the first output shaft for the direct axis current and a maximum torque generated by the first output shaft at the shaft speed associated with the direct axis current; and
a third control lookup table provides the quadrature axis current for an associated torque percentage and associated ratio, the associated ratio being the dc bus voltage divided by the shaft speed associated with the quadrature axis current, the associated torque percentage being based on the torque generated by the first output shaft for the quadrature axis current and a maximum torque generated by the first output shaft at the shaft speed associated with the quadrature axis current.

9. A machine controller having control look-up tables according to claim 8.

10. A non-transitory computer readable medium storing control look-up tables according to claim 8.

11. A controller for controlling an interior permanent magnet (IPM) machine, the controller comprising:
   a memory configured to store control look-up tables according to claim 8; and
   a processor configured to control the IPM machine based on the look-up tables.

12. The method of claim 1, wherein the determining step, for each peak current magnitude, comprises:
   applying the peak current magnitude and a series of current angles to a controller for the test IPM machine, each current angle indicating amounts of the peak current magnitude appearing as the direct axis current and the quadrature axis current.

13. The method of claim 12, wherein the applying step comprises:
   adjusting the current angle until a desired torque is produced by the first output shaft.

14. The method of claim 13, wherein the desired torque is a maximum torque.

15. The method of claim 13, wherein the desired torque is a maximum torque for which a limit on terminal-to-terminal voltage of the test IPM machine is not exceeded.

16. The method of claim 15, wherein the applying step applies the peak current magnitudes and the current angles such that current applied to the test IPM machine remains below a current limit.

17. The method of claim 13, wherein the applying step applies successively higher peak current magnitudes until one of a desired torque is obtained, torque produced by the output shaft decreases, current applied to the test 1PM machine will exceed a current limit, and a terminal-to-terminal voltage of the test IPM machine will exceed a voltage limit.

18. The method of claim 13, wherein the applying step includes measuring the torque produced by the first output shaft.

19. The method of claim 13, wherein the applying step includes calculating the torque produced by the first output shaft based on at least one of power supplied to the test IPM machine and power generated from the secondary speed control machine.

20. The method of claim 12, wherein the applying step applies the peak current magnitudes such that current applied to the test IPM machine does not exceed a current limit, and a terminal-to-terminal voltage of the test IPM machine does not exceed a voltage limit.

21. The method of claim 1, prior to the controlling step, further comprising:
   placing the test IPM machine in a desired operation state based on one of the first to nth desired shaft speed.

22. The method of claim 21, wherein the placing step applies a zero peak current magnitude and a zero current angle to the test machine controller if the one of the first to nth desired shaft speeds is equal to or below a critical speed for the test IPM machine, the current angle indicating amounts of the peak current magnitude appearing as the direct axis current and the quadrature axis current.

23. The method of claim 21, wherein the placing step applies a desired peak current magnitude and a 90 degree current angle to the test machine controller if the one of the first to nth desired shaft speeds is above a critical speed for the test IPM machine.

24. The method of claim 1, wherein the characterization data includes torque generated by the first output shaft for each pair of desired direct and quadrature axis currents.

25. The method of claim 24, wherein the characterization data further includes efficiency of the test IPM machine and power electronics losses associated with the test machine controller.

26. The method of claim 1, wherein the test IPM machine is in one of a motoring mode and a generation mode.

* * * * *